(12) United States Patent
Kojima

(10) Patent No.: US 7,995,319 B2
(45) Date of Patent: Aug. 9, 2011

(54) SEMICONDUCTOR DEVICE WITH OVERCURRENT PROTECTION CIRCUIT

(75) Inventor: Masaki Kojima, Shiga (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 274 days.

(21) Appl. No.: 12/453,210

(22) Filed: May 1, 2009

(65) Prior Publication Data

US 2009/0284885 A1      Nov. 19, 2009

(30) Foreign Application Priority Data

May 15, 2008   (JP) ................................ 2008-128497

(51) Int. Cl.
*H02H 3/08*      (2006.01)
*H02H 9/02*      (2006.01)

(52) U.S. Cl. ....................................................... 361/93.1

(58) Field of Classification Search .................. 361/93.1
See application file for complete search history.

(56) References Cited

U.S. PATENT DOCUMENTS

| | | | | |
|---|---|---|---|---|
| 5,272,392 A | * | 12/1993 | Wong et al. | 327/109 |
| 5,422,593 A | * | 6/1995 | Fujihira | 327/561 |
| 5,578,956 A | * | 11/1996 | Rossi et al. | 327/309 |
| 5,903,422 A | * | 5/1999 | Hosokawa | 361/93.1 |
| 7,626,792 B2 | * | 12/2009 | Mitsuda | 361/93.1 |

FOREIGN PATENT DOCUMENTS

| | | |
|---|---|---|
| JP | 5-235365 A | 9/1993 |
| JP | 8-316472 | 11/1996 |
| JP | 2006-303843 A | 11/2006 |

* cited by examiner

*Primary Examiner* — Ronald W Leja
(74) *Attorney, Agent, or Firm* — McGinn IP Law Group, PLLC

(57) ABSTRACT

A semiconductor device 1 includes an output MOS transistor M2, a sense MOS transistor M3, a voltage conversion circuit 20 that converts a sense current of the sense MOS transistor M3 into a sense voltage, and control MOS transistor M10 having a gate and a source which receive the sense voltage therebetween and a drain connected to a gate of the output MOS transistor M2. The voltage conversion circuit 20 includes a first MOS transistor M21 diode-connected and a second MOS transistor M22 connected in series to the first transistor M21. A gate of the second transistor M22 is connected to a node between a gate control circuit 6 and a resistor R5 which is connected to the gate of the output MOS transistor M2. A variation in threshold voltage caused by characteristic variation of the control MOS transistor M10 causes a variation in output current limiting value, but the threshold voltage of the first MOS transistor M21 diode-connected varies similarly, whereby the variation in threshold voltage caused by characteristic variation of the control MOS transistor M10 is cancelled. As a result, the variation in output current limiting value is suppressed.

8 Claims, 3 Drawing Sheets

SEMICONDUCTOR DEVICE WITH OVERCURRENT PROTECTION CIRCUIT

CROSS-REFERENCE TO RELATED APPLICATIONS

This application is based upon, claims the benefit of priority of, and incorporates by reference the contents of Japanese Patent Application No. 2008-128497 filed on May 15, 2008.

BACKGROUND

1. Field of the Invention

The present invention relates to a semiconductor device with an overcurrent protection circuit that protects an output MOS transistor against overcurrent.

2. Description of Related Art

Automobiles, home electric appliances and the like use power devices to regulate large current or large voltage. In the power devices, extraordinarily large current (overcurrent) may flow through an output MOS transistor due to load short circuit or other trouble, causing the output MOS transistor to break. Thus, what is called an IPD (Intelligent Power Device) has been in use; the IPD includes an overcurrent protection circuit that protects an output MOS transistor against overcurrent.

FIG. 3 illustrates a block diagram of an overcurrent protection circuit for a semiconductor device according to prior art. The semiconductor device 101 includes, as illustrated in FIG. 3, an output MOS transistor M102 and an overcurrent protection circuit 104. The output MOS transistor M102 has a drain connected to a power source terminal 108, a source connected to an output terminal 109 and a gate connected to a charge pump 106 via a resistor R105. Power source voltage (VBB) of a battery, for example, is applied to the power source terminal 108.

The overcurrent protection circuit 104 includes a sense MOS transistor M103, control MOS transistor M110 and sense resistor Rs120. The sense MOS transistor M103 detects an output current flowing through the output MOS transistor M102, and its gate and drain are connected to the gate and drain of the output MOS transistor M102, respectively. The sense resistor Rs120 converts a sense current Isens of the sense MOS transistor M103 into a sense voltage. The control MOS transistor M110 detects an overcurrent state by use of the sense voltage and limiting the output current flowing through the output MOS transistor M102.

As the sense MOS transistor M103, a MOS transistor is used which is different in the number of cells from the output MOS transistor M102 but has the same structure. The sense current Isens corresponding to a cell number ratio relative to the output MOS transistor M102 is made to flow through the sense MOS transistor M103, whereby the output current flowing through the output MOS transistor M102 is monitored with high accuracy. The sense current Isens flowing from the sense MOS transistor M103 produces a potential difference across the sense resistor Rs120. This potential difference is proportional to the output current flowing through the output MOS transistor M102. Using the potential difference, the gate-source voltage of the output MOS transistor M102 which depends on a drain-source resistance of the control MOS transistor M110 is varied, whereby the output current is regulated.

FIG. 1(B) of Japanese Patent Laid-Open Publication No. HEI 5-235365 (Patent Document 1) and FIG. 1 of Japanese Patent Laid-Open Publication No. 2006-303843 (Patent Document 2) disclose a circuit configuration similar to the above described semiconductor device.

Recently, the area of semiconductor chip has been increasingly reduced to achieve cost reduction. Accordingly, permissible breakdown voltage of the output MOS transistor has been increasingly small. Thus, the output MOS transistor is more likely to break than before, so there are strong demands for a technique for achieving higher accuracy in the function of regulating the output current.

According to the prior art, in the mechanism of varying the gate-source voltage of the output MOS transistor M102, i.e., of varying the drain-source resistance of the control MOS transistor M110, variations in electrical characteristics in both the sense resistor Rs120 and the control MOS transistor M110 should be considered. The variations significantly affect a variation in circuit characteristic, that is, a variation in output current limiting value.

Factors affecting the drain-source resistance value of the control MOS transistor M110 include gate-source voltage Vgs of the control MOS transistor M110, the threshold voltage of the control MOS transistor M110 and the drain-source voltage of the control MOS transistor M110. Here, the drain-source voltage of the control MOS transistor M110 is equal to the gate-source voltage of the output MOS transistor M102; and when these voltages are assumed to be constant, the factors affecting the drain-source resistance value of the control MOS transistor M110 are the gate-source voltage Vgs of the control MOS transistor M110 and the threshold voltage of the control MOS transistor M110.

The gate-source voltage Vgs of the control MOS transistor M110 is expressed by the following <formula 1>.

$$Vgs(M110) = Rs \times Isens \qquad \text{<formula 1>}$$

where Isens is a sense current outputted from the sense MOS transistor M103 and Rs is a resistance of the sense resistor Rs120. Here, when Isens is assumed to be constant, a variation in resistance Rs of the sense resistor Rs120 becomes a main factor.

A variation in threshold voltage of the control MOS transistor M110 occurs independently of a variation in resistance Rs of the sense resistor Rs120. Thus, if the variation in resistance Rs of the sense resistor Rs120 and the variation in threshold voltage of the control MOS transistor M110 are not tightly controlled, the variation in output current limiting value may increase.

SUMMARY

In one feature according to the present invention, a semiconductor device includes: an output MOS transistor connected between a power source terminal and an output terminal; a sense MOS transistor that produces a sense current proportional to an output current flowing through the output MOS transistor; a voltage conversion circuit that converts the sense current into a sense voltage; a control MOS transistor having a gate and a source which receive the sense voltage therebetween and a drain connected to a gate of the output MOS transistor. The voltage conversion circuit includes a first MOS transistor diode-connected and a second MOS transistor connected in series to the first MOS transistor. The control MOS transistor and the first MOS transistor have substantially the same threshold voltage characteristic.

In the semiconductor device according to the present invention, the variation in output current limiting value can be reduced from the following reason. Firstly, factors affecting the drain-source resistance value of the control MOS transistor include the gate-source voltage Vgs of the control MOS transistor, the threshold voltage of the control MOS transistor and the drain-source voltage of the control MOS transistor. Here, the drain-source voltage of the control MOS transistor is equal to the gate-source voltage of the output MOS transistor. Thus, when these voltages are assumed to be constant, the factors affecting the drain-source resistance value of the control MOS transistor are the gate-source voltage Vgs of the control MOS transistor and the threshold voltage of the control MOS transistor.

Here, when the threshold voltage of the first MOS transistor is Vth and an on-resistance of the second MOS transistor is Ron and the sense current outputted from the sense MOS transistor is Isens, the gate-source voltage Vgs of the control MOS transistor is expressed by the following <formula 2>.

$$Vgs=Vth+Ron \times Isens \qquad \text{<formula 2>}$$

A variation in threshold voltage caused by characteristic variation of the control MOS transistor is cancelled by the first MOS transistor diode-connected. Consequently, the variation caused by threshold voltage variation of the control MOS transistor can be suppressed.

The on-resistance Ron of the second MOS transistor preferably has a value in a linear range of MOS transistor. Accordingly, the range of variation can be suppressed, compared to the sense resistor described in Patent Document 1. As a result, the variation factor of the drain-source resistance value of the control MOS transistor which affects the gate-source voltage of the output MOS transistor is significantly small, so the variation in output current limiting value can be reduced.

According to the present invention, it is possible to provide a semiconductor device in which the variation in output current limiting value is suppressed, so that the function of regulating the output current has higher accuracy.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF THE PREFERRED EMBODIMENTS

The invention will now be described herein with reference to illustrative embodiments. Those skilled in the art will recognize that many alternative embodiments can be accomplished using the teachings of the present invention and that the invention is not limited to the embodiments illustrated for explanatory purposes.

Embodiment 1

Figure 1:
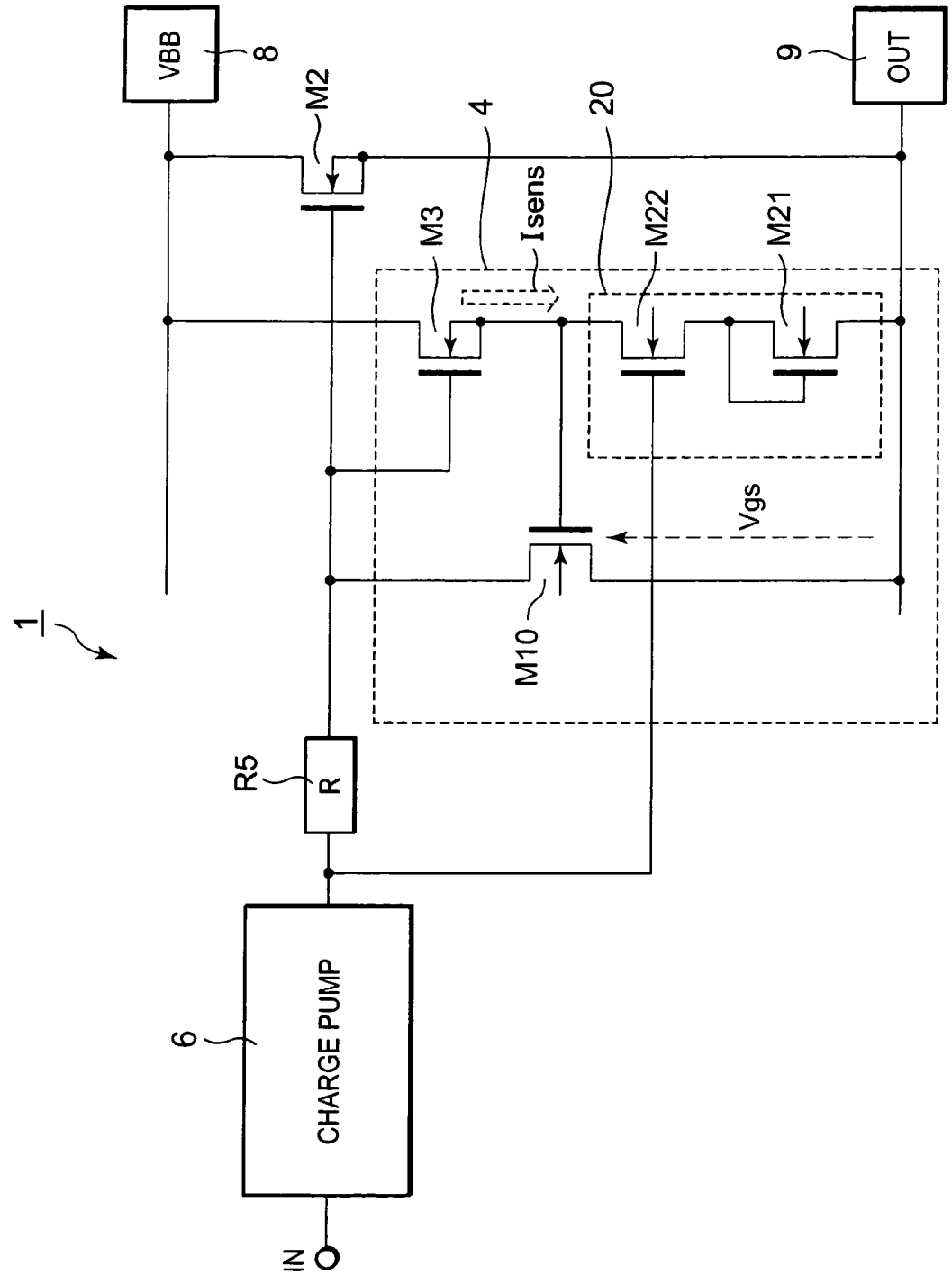
FIG. 1 is a block diagram of a semiconductor device 1 with an overcurrent protection circuit according to Embodiment 1 of the present invention.

A semiconductor device 1 with an overcurrent protection circuit according to Embodiment 1 of the present invention will be described with reference to FIG. 1. Circuit elements of the semiconductor device 1 can be formed on a semiconductor substrate such as silicon substrate by a well-known semiconductor device fabricating technique. The semiconductor device 1 includes an output MOS transistor M2, an overcurrent protection circuit 4, resistor R5, and a gate control circuit 6 which comprises a charge pump.

The output MOS transistor M2 is constituted of an N-channel MOS transistor, for example. The drain of the output MOS transistor M2 is connected to a power source terminal 8. The source of the output MOS transistor M2 is connected to an output terminal 9. The gate of the output MOS transistor M2 is connected to the gate control circuit 6 via the resistor R5. Applied to the power source terminal 8 is a battery power source voltage (VBB), for example. Connected to the output terminal 9 is a load (not illustrated) such as a lamp, head light or power window. When the output MOS transistor M2 is turned on/off, the load is driven.

The resistor R5 has one end connected to the gate control circuit 6 and the other end connected to the gate of the output MOS transistor M2. The resistor R5 regulates the voltage of a gate control signal applied to the output MOS transistor M2. The gate control circuit 6 operates based on a control signal IN inputted from a control signal input circuit (not illustrated). A boost voltage boosted by the charge pump is outputted from the gate control circuit 6. The boost voltage is inputted to the gate of the output MOS transistor M2 via the resistor R5. The output MOS transistor M2 outputs, according to the control signal IN inputted to the gate control circuit 6, an output current to the load (not illustrated) via the output terminal 9.

The overcurrent protection circuit 4 includes a sense MOS transistor M3, a control MOS transistor M10 and a voltage conversion circuit 20. The sense MOS transistor M3 detects the output current flowing through the output MOS transistor M2. The drain of the sense MOS transistor M3 is connected to the power source terminal 8. The gate of the sense MOS transistor M3 is connected to the gate control circuit 6 via the resistor R5. That is, the gates and the drains of the sense MOS transistor M3 and output MOS transistor M2 are connected to each other, respectively. The source of the sense MOS transistor M3 is connected to the gate of the control MOS transistor M10 and to the voltage conversion circuit 20.

The sense MOS transistor M3 is constituted of a MOS transistor which is 1/Nth (N being a natural number) the size (the number of cells) of the output MOS transistor M2 and has the same channel-type and structure as the output MOS transistor M2. The sense MOS transistor M3 monitors, based on the current ratio (cell number ratio) to the output MOS transistor M2, the output current flowing through the output MOS transistor M2 with high accuracy. Then, the sense MOS transistor M3 outputs a sense current Isens proportional to the output current flowing through the output MOS transistor M2. The sense current Isens flowing from the sense MOS transistor M3 is converted into a sense voltage by the voltage conversion circuit 20. This sense voltage varies according to the sense current Isens.

The control MOS transistor M10 receives a voltage across the voltage conversion circuit 20 through the gate and source thereof; and the drain thereof is connected to the gate of the output MOS transistor M2. In other words, the drain-source path of the control MOS transistor M10 for limiting overcurrent is connected between the gate and the source of the output MOS transistor M2; and the gate of the control MOS transistor M10 is connected to a node between the sense MOS transistor M3 and the voltage conversion circuit 20.

The semiconductor device 1 includes, as the voltage conversion circuit 20, a first MOS transistor M21 diode-connected and a second MOS transistor M22. The first MOS transistor M21 is constituted of a MOS transistor for which the threshold voltage Vth thereof has substantially the same characteristic as the threshold voltage of the control MOS transistor M10. For example, the first MOS transistor M21 is fabricated by the same process as the control MOS transistor M10 and thus subjected to the same variation in fabrication. The drain-source path of the second MOS transistor M22 is connected between the sense MOS transistor M3 and the output terminal 9 and arranged in series to the first MOS transistor M21; and the gate thereof is connected to a node between the gate control circuit 6 and resistor R5. The control MOS transistor M10, the first MOS transistor M21 and the second MOS transistor M22 are each constituted of an N-channel MOS transistor having the same characteristic.

In the semiconductor device 1, the drain of the second MOS transistor M22 is connected to the source of the sense MOS transistor M3, and the gate thereof is connected to the node between the gate control circuit 6 and the resistor R5, and the source thereof is connected to the drain and the gate of the first MOS transistor M21. The source of the first MOS transistor M21 is connected to the output terminal 9.

The semiconductor device 1 having the above configuration is suitable for use in an automobile electric equipment-system driven by large current or large voltage, and also suitable for use in a system driven by large current or large voltage such as a home electric appliance and a robot.

The operation of the semiconductor device 1 will be described. In the ordinary operation, while power source voltage VBB is supplied to the drain of the output MOS transistor M2, a gate control signal is inputted from the gate control circuit 6 via the resistor R5 to the gate of the output MOS transistor M2. As a result, the output MOS transistor M2 changes to an ON state, and a prescribed output current is supplied to the load (not illustrated) via the output terminal 9.

Here, while the output MOS transistor M2 is in an ON state, when short circuit of a load connected to the output terminal 9 or other trouble occurs, overcurrent flows through the output MOS transistor M2. Then, a proportionate increase in the sense current Isens flowing through the sense MOS transistor M3 occurs.

When the sense current Isens corresponding to the cell number ratio to the output MOS transistor M2 flows through the sense MOS transistor M3, the sense MOS transistor M3 monitors the output current flowing through the output MOS transistor M2 with high accuracy. The voltage conversion circuit 20 produces a potential difference (sense voltage) from the sense current Isens flowing from the sense MOS transistor M3. This potential difference (sense voltage) is proportional to the output current flowing through the output MOS transistor M2. Using the potential difference (sense voltage), the gate-source voltage of the output MOS transistor M2 which depends on a drain-source resistance of the control MOS transistor M10 is varied, whereby the output current is regulated.

That is, the output signal of the sense MOS transistor M3 is converted into a voltage signal by the voltage conversion circuit 20, and when this voltage signal is equal to or greater than the threshold voltage of the control MOS transistor M10, the control MOS transistor M10 changes to an ON state and a current path is generated between the drain and the source of the control MOS transistor M10. As a result, the voltage of the gate control signal applied to both gates of the output MOS transistor M2 and sense MOS transistor M3 is lowered to execute the output current limiting operation.

There will now be described the reason why the variation in output current limiting value in the semiconductor device 1 can be suppressed, allowing achievement of higher accuracy in the output current regulating function.

Factors affecting the drain-source resistance value of the control MOS transistor M10 include the gate-source voltage Vgs of the control MOS transistor M10, the threshold voltage of the control MOS transistor M10 and the drain-source voltage of the control MOS transistor M10. Here, the drain-source voltage of the control MOS transistor M10 is equal to the gate-source voltage of the output MOS transistor M2. Thus, when these voltages are assumed to be constant, the factors affecting the drain-source resistance value of the control MOS transistor M10 are the gate-source voltage Vgs of the control MOS transistor M10 and the threshold voltage of the control MOS transistor M10.

The gate-source voltage Vgs of the control MOS transistor M10 is expressed by the following <formula 3>.

$$Vgs(M10) = Vth(M21) + Ron(M22) \times Isens \qquad \text{<formula 3>}$$

where Vth is the threshold voltage of the first MOS transistor M21, Ron is the on-resistance of the second MOS transistor M22, and Isens is a sense current outputted from the sense MOS transistor M3. Here, the threshold voltage of the control MOS transistor M10 has the same characteristic as the threshold voltage Vth of the first MOS transistor M21. Accordingly, when the threshold voltage of the control MOS transistor M10 varies due to characteristic variation thereof, the threshold voltage of the first MOS transistor M21 also varies similarly. Consequently, the variation caused by threshold voltage variation of the control MOS transistor M10 can be cancelled.

Further, a linear range of MOS transistor is used for the on-resistance Ron of the second MOS transistor M22. More specifically, a boost voltage outputted form the gate control circuit 6 is applied to the gate of the second MOS transistor M22, so that the second MOS transistor M22 operates in a linear range thereof. Thus, the variation range can be suppressed, compared to the sense resistor Rs120 of the conventional semiconductor device 101. More specifically, the variation in resistance value of the sense resistor Rs120 in the semiconductor device 101 is in a range of about 30 to 40%, but for the second MOS transistor M22 in the semiconductor device 1, the variation range can be improved to about 10%. As a result, the variation factor of the drain-source resistance value of the control MOS transistor M10 which affects the gate-source impedance of the output MOS transistor M2 is significantly small, so the variation in output current limiting value can be reduced. Consequently, troubles of breakdown of the output MOS transistor M2 and meltdown of bonding wire of the semiconductor device 1 can be prevented with higher accuracy.

Here, Japanese Patent Laid-Open Publication No. HEI 8-316472 (Patent Document 3) discloses a technique by which, in converting sense current into sense voltage, in order to reduce effects of resistance value variation of a resistor formed of polycrystalline silicon, a PN-junction diode formed of polycrystalline silicon is connected in series to the resistor formed of polycrystalline silicon. According to Patent Document 3, an offset voltage is generated using a built-in potential (forward voltage when the diode starts to turn on) of the PN-junction diode and the resistance value of the resistor can be decreased by the offset voltage to reduce the variation of the resistance value, so that sense voltage variation is suppressed.

However, it is difficult to provide the built-in potential of the PN-junction diode with the same characteristic as threshold voltage Vth of MOS transistor. More specifically, in Patent Document 3, a MOS transistor is used to shutdown the output transistor when an overcurrent occurs. It is extremely difficult to provide the built-in potential of the PN-junction diode with the same characteristic as threshold voltage of the MOS transistor, so a variation in threshold voltage of the MOS transistor cannot be cancelled by the PN-junction diode. Consequently, according to Patent Document 3, a variation in output current limiting value cannot be suppressed.

Embodiment 2

An example of another semiconductor device according to Embodiment 2 of the present invention will be described. In the following description, the same reference numerals are applied to parts corresponding to those of Embodiment 1, and an explanation thereof is omitted appropriately.

A semiconductor device 1a according to Embodiment 2 has the same basic configuration as that of Embodiment 1 except the following point. That is, the difference between the semiconductor device 1a according to Embodiment 2 and the semiconductor device 1 according to Embodiment 1 lies in that the connecting location of the first MOS transistor M21 in the semiconductor device 1 is replaced with that of the second MOS transistor M22.

Figure 2:
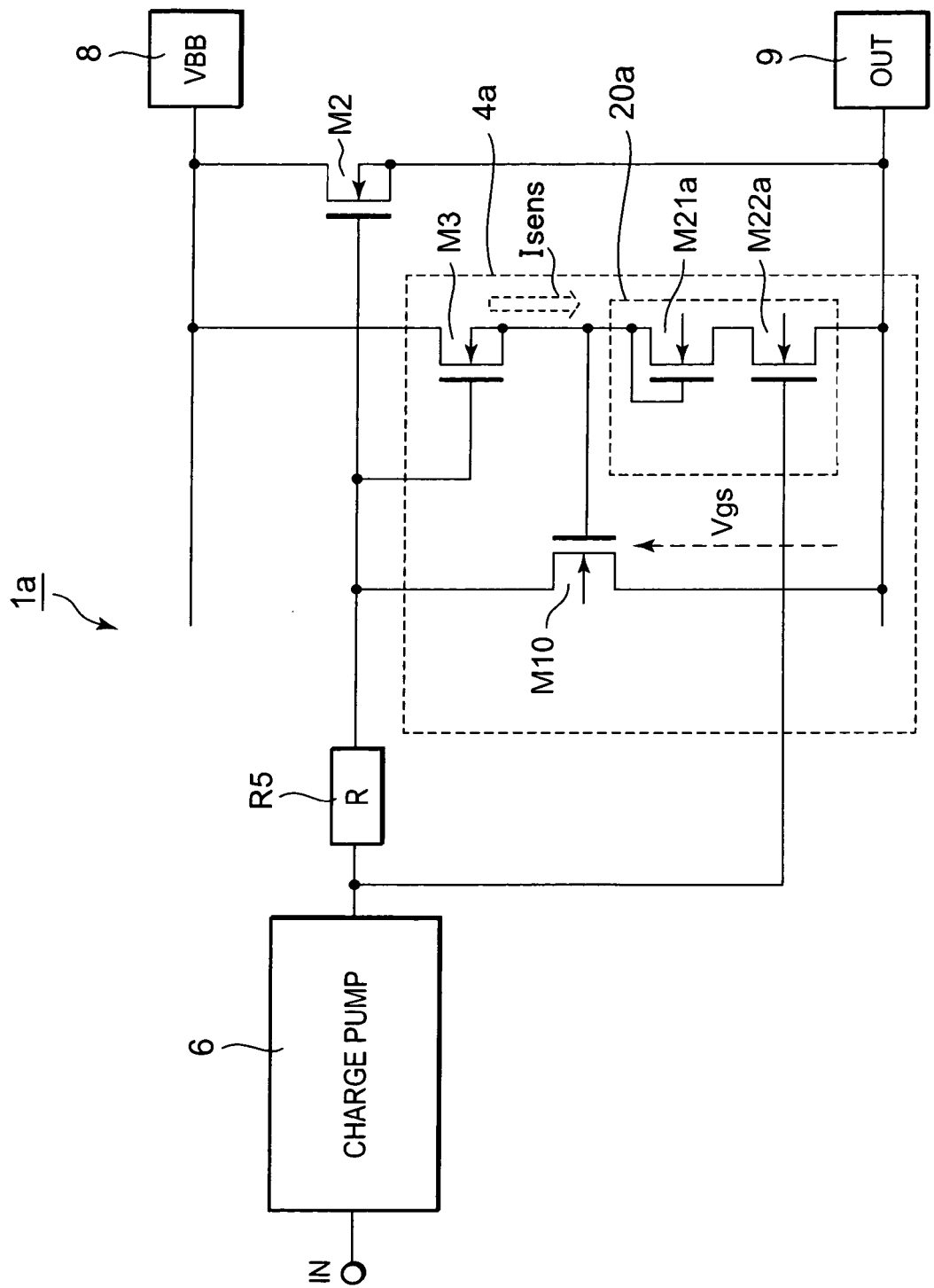
FIG. 2 is a block diagram of a semiconductor device 1a with an overcurrent protection circuit according to Embodiment 2 of the present invention.
Figure 3:
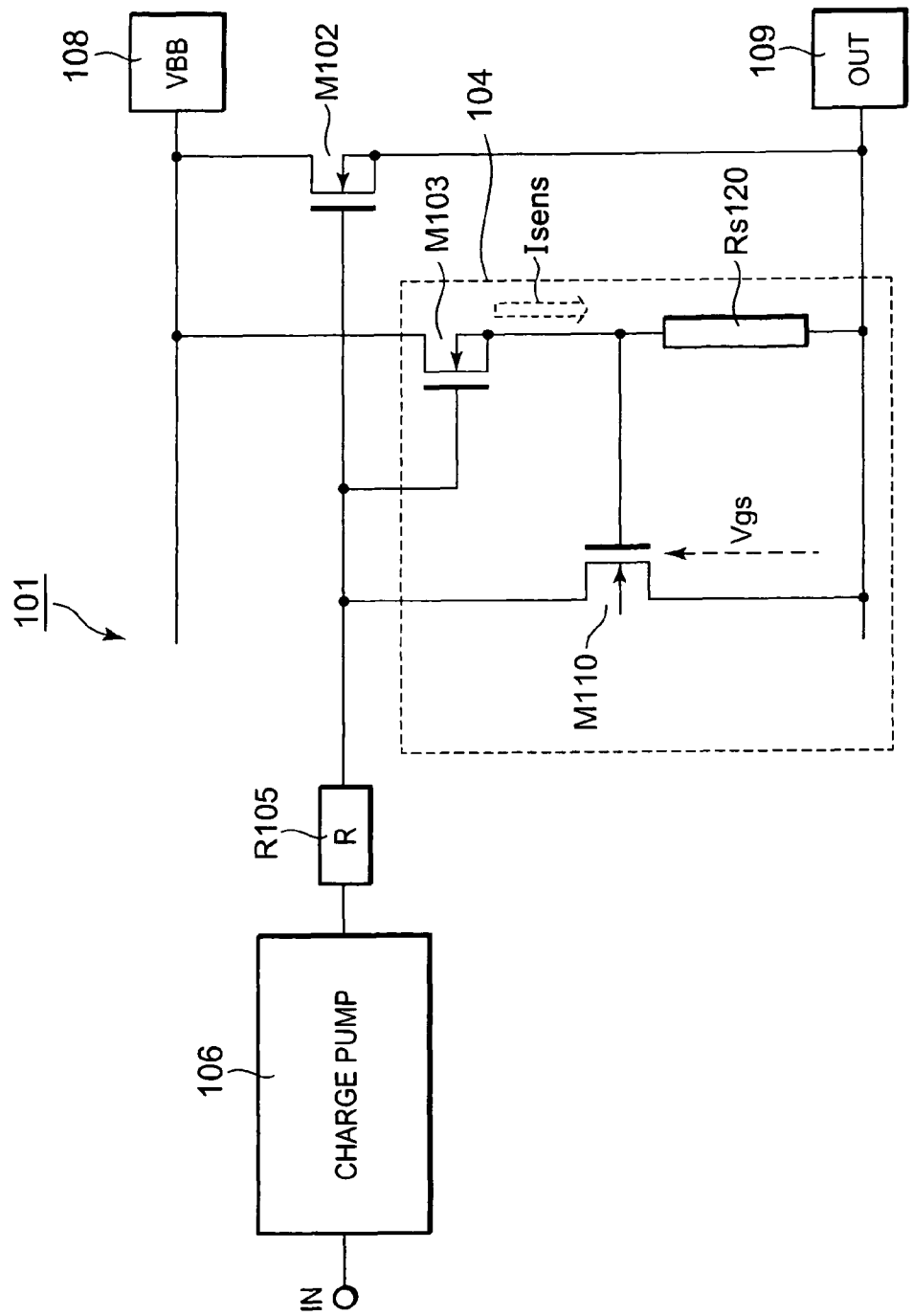
FIG. 3 is a block diagram of a semiconductor device 101 with an overcurrent protection circuit according to prior art.

The semiconductor device 1a will be described with reference to FIG. 2. An overcurrent protection circuit 4a of the semiconductor device 1a includes a sense MOS transistor M3, the control MOS transistor M10 and a voltage conversion circuit 20a. The voltage conversion circuit 20a is constituted of a first MOS transistor M21a diode-connected and second MOS transistor M22a.

The first MOS transistor M21a is constituted of a MOS transistor for which threshold voltage Vth has substantially the same characteristic as the threshold voltage of the control MOS transistor M10. The drain-source path of the second MOS transistor M22a is connected between the sense MOS transistor M3 and the output terminal 9 and arranged in series to the first MOS transistor M21a.

In the semiconductor device 1a, the drain and the gate of the first MOS transistor M21a are connected to the source of a sense MOS transistor M3. The source of the first MOS transistor M21a is connected to the drain of the second MOS transistor M22a. The gate of the second MOS transistor M22a is connected to a node between a gate control circuit 6 and resistor R5. The source of the second MOS transistor M22a is connected to the output terminal 9.

In the semiconductor device 1a, similarly to the semiconductor device 1, when the threshold voltage varies due to characteristic variation of the control MOS transistor M10, the threshold voltage of the first MOS transistor M21a also varies similarly. Consequently, the variation caused by threshold voltage variation of the control MOS transistor M10 can be cancelled. Further, a linear range of MOS transistor is used for the on-resistance Ron of the second MOS transistor M22a. Thus, the resistance value variation range can be suppressed similarly to the case of the second MOS transistor M22 in the semiconductor device 1. That is, similarly to the semiconductor device 1, the variation in output current limiting value can be suppressed, allowing achievement of higher accuracy in the output current regulating function. Consequently, troubles of breakdown of the output MOS transistor M2 and meltdown of bonding wire of the semiconductor device 2 can be prevented with higher accuracy.

Although the present invention has been described above in connection with several preferred embodiments thereof, it will be appreciated by those skilled in the art that those embodiments are provided solely for illustrating the invention, and should not be relied upon to construe the appended claims in a limiting sense.

For example, for the semiconductor device according to the present invention, any circuit or element such as an overheat detecting circuit can be arranged therein. In the embodiments 1 and 2 described above, a case has been described in which an N-channel MOS transistor is used as the output MOS transistor M2 and the sense MOS transistor M3. However, a P-channel MOS transistor may be used instead. Further, in the embodiments 1 and 2 described above, a case has been described in which the control MOS transistor (M10), the first MOS transistor (M21, M21a) and the second MOS transistor (M22, M22a) are each constituted of an N-channel MOS transistor. However, these MOS transistors may be constituted of a P-channel MOS transistor having the same characteristic. When a change is made from N-channel MOS transistor to P-channel MOS transistor, a semiconductor device can be implemented for which the connecting relationship and voltage level are modified appropriately without departing from the gist of the present invention.

What is claimed is:

1. A semiconductor device, comprising:
   an output MOS transistor having a drain connected to a power source terminal, a source connected to an output terminal and a gate receiving a gate control signal from a gate control circuit;
   a sense MOS transistor having a gate and a drain which are connected to the gate and the drain of the output MOS transistor, respectively, and a source;
   a voltage conversion circuit connected between the source of the sense MOS transistor and the output terminal, and converting a sense current flowing through the sense MOS transistor into a sense voltage; and
   a control MOS transistor having a gate and a source which receive the sense voltage therebetween and a drain connected to the gate of the output MOS transistor,
   wherein the voltage conversion circuit includes:
   a first MOS transistor diode-connected; and
   a second MOS transistor, connected in series to the first MOS transistor, and having a gate connected to the gate control circuit.

2. The semiconductor device according to claim 1, wherein a threshold voltage of the first MOS transistor has substantially the same characteristic as a threshold voltage of the control MOS transistor.

3. The semiconductor device according to claim 1, wherein a drain of the second MOS transistor is connected to the source of the sense MOS transistor, and a gate and a drain of the first MOS transistor are connected to each other and connected to a source of the second MOS transistor, and a source of the first MOS transistor is connected to the output terminal.

4. The semiconductor device according to claim 1, wherein a gate and a drain of the first MOS transistor are connected to each other and connected to the source of the sense MOS transistor, and a drain of the second MOS transistor is connected to a source of the first MOS transistor, and a source of the second MOS transistor is connected to the output terminal.

5. The semiconductor device according to claim 1, wherein the output MOS transistor is an N-channel MOS transistor, and the gate control circuit comprises a charge pump.

6. The semiconductor device according to claim 1, wherein the control MOS transistor and the first MOS transistor are of the same conductivity type.

7. The semiconductor device according to claim 1, further comprises
a resister connected between the gate control circuit and the gate of the output MOS transistor.

8. The semiconductor device according to claim 7, wherein the gate of the second MOS transistor is connected to a node between the gate control circuit and the resistor.

* * * * *